US009772688B2

(12) United States Patent
Patel et al.

(10) Patent No.: US 9,772,688 B2
(45) Date of Patent: Sep. 26, 2017

(54) HAPTIC FEEDBACK ASSEMBLY

(71) Applicant: Apple Inc., Cupertino, CA (US)

(72) Inventors: Dhaval Chandrakant Patel, Cupertino, CA (US); Jonah A. Harley, Cupertino, CA (US); Peteris K. Augenbergs, Cupertino, CA (US); Derryk C. Davis, Cupertino, CA (US); Scott J. McEuen, Cupertino, CA (US); John M. Brock, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/045,628

(22) Filed: Feb. 17, 2016

(65) Prior Publication Data

US 2016/0162030 A1     Jun. 9, 2016

Related U.S. Application Data

(63) Continuation of application No. 14/792,267, filed on Jul. 6, 2015.

(60) Provisional application No. 62/129,943, filed on Mar. 8, 2015, provisional application No. 62/057,751, filed on Sep. 30, 2014.

(51) Int. Cl.
| | | |
|---|---|---|
| *G06F 3/01* | (2006.01) | |
| *G06F 3/041* | (2006.01) | |
| *G06F 3/0354* | (2013.01) | |
| *G06F 1/16* | (2006.01) | |
| *H01F 7/126* | (2006.01) | |
| *H05K 3/32* | (2006.01) | |

(52) U.S. Cl.
CPC ............. *G06F 3/016* (2013.01); *G06F 1/169* (2013.01); *G06F 3/03547* (2013.01); *G06F 3/041* (2013.01); *G06F 3/0414* (2013.01); *H01F 7/126* (2013.01); *H05K 3/325* (2013.01); *G06F 2203/04103* (2013.01); *G06F 2203/04105* (2013.01); *H05K 2201/10409* (2013.01)

(58) Field of Classification Search
CPC ........ G06F 3/016; G06F 3/041; G06F 3/0414; G06F 3/044; G09G 5/006
See application file for complete search history.

(56) References Cited

U.S. PATENT DOCUMENTS

| | | | |
|---|---|---|---|
| 3,176,241 A | 3/1965 | Hogan | |
| 4,577,174 A | 3/1986 | Lemmer | |
| 4,716,393 A | 12/1987 | Logie | |

(Continued)

FOREIGN PATENT DOCUMENTS

| | | |
|---|---|---|
| CN | 1659583 | 8/2005 |
| CN | 101477422 A | 7/2009 |

(Continued)

OTHER PUBLICATIONS

Pave et al., "Real Time Platform Middleware for Transparent Prototyping of Haptic Applications," 2004.

(Continued)

*Primary Examiner* — Abbas Abdulselam
(74) *Attorney, Agent, or Firm* — Brownstein Hyatt Farber Schreck, LLP

(57) ABSTRACT

A haptic feedback assembly includes interconnections for mechanically and electrically securing a haptic actuator in a track pad assembly so as to securely and efficiently provide haptic feedback to a user.

20 Claims, 11 Drawing Sheets

(56) References Cited

U.S. PATENT DOCUMENTS

| | | | |
|---|---|---|---|
| 4,897,582 A | 1/1990 | Otten et al. | |
| 5,231,336 A | 7/1993 | van Namen | |
| 5,541,372 A | 7/1996 | Baller et al. | |
| 5,999,168 A | 12/1999 | Rosenberg et al. | |
| 6,100,874 A | 8/2000 | Schena et al. | |
| 6,219,038 B1* | 4/2001 | Cho | G06F 1/1616 345/173 |
| 6,337,678 B1 | 1/2002 | Fish | |
| 6,388,655 B1 | 5/2002 | Leung | |
| 6,518,954 B1 | 2/2003 | Chen | |
| 6,816,049 B2 | 11/2004 | Watanabe | |
| 6,937,124 B1 | 8/2005 | Nakamura | |
| 7,031,592 B2 | 4/2006 | Akieda | |
| 7,091,886 B2 | 8/2006 | DePue | |
| 7,152,482 B2 | 12/2006 | Ueno | |
| 7,176,897 B2 | 2/2007 | Roberts | |
| 7,219,549 B2 | 5/2007 | Honkura et al. | |
| 7,245,293 B2 | 7/2007 | Hoshino et al. | |
| 7,283,120 B2 | 10/2007 | Grant | |
| 7,331,245 B2 | 2/2008 | Nishimura | |
| 7,436,396 B2 | 10/2008 | Akieda | |
| 7,443,384 B2 | 10/2008 | Harada | |
| 7,511,706 B2 | 3/2009 | Schena | |
| 7,525,532 B2 | 4/2009 | Liu et al. | |
| 7,532,202 B2 | 5/2009 | Roberts | |
| 7,557,051 B2 | 7/2009 | Ryu | |
| 7,567,232 B2 | 7/2009 | Rosenberg | |
| 7,639,232 B2 | 12/2009 | Grant et al. | |
| 7,656,393 B2 | 2/2010 | King | |
| 7,685,538 B2 | 3/2010 | Fleck et al. | |
| 7,692,078 B2 | 4/2010 | Hayashi | |
| 7,710,397 B2 | 5/2010 | Krah et al. | |
| 7,791,506 B2 | 9/2010 | Riihimaki | |
| 7,825,903 B2 | 11/2010 | Anastas et al. | |
| 7,877,707 B2 | 1/2011 | Westerman | |
| 7,920,225 B2 | 4/2011 | Nishikawa et al. | |
| 7,920,694 B2 | 4/2011 | Cruz-Hernandez et al. | |
| 7,948,337 B2 | 5/2011 | Chu | |
| 7,952,566 B2 | 5/2011 | Poupyrev | |
| 8,059,104 B2 | 11/2011 | Shahoian | |
| 8,081,156 B2 | 12/2011 | Ruettiger | |
| 8,084,968 B2 | 12/2011 | Murray et al. | |
| 8,117,912 B2 | 2/2012 | Kawakubo | |
| 8,132,468 B2 | 3/2012 | Radivojevic | |
| 8,139,038 B2 | 3/2012 | Chueh | |
| 8,144,129 B2 | 3/2012 | Hotelling | |
| 8,169,332 B2 | 5/2012 | Son | |
| 8,169,401 B2 | 5/2012 | Hardwick | |
| 8,169,402 B2 | 5/2012 | Shahoian et al. | |
| 8,232,969 B2 | 7/2012 | Grant | |
| 8,252,695 B2 | 8/2012 | Tan | |
| 8,260,337 B2 | 9/2012 | Periyalwar et al. | |
| 8,264,465 B2 | 9/2012 | Grant et al. | |
| 8,279,175 B2 | 10/2012 | Kim et al. | |
| 8,287,522 B2 | 10/2012 | Moses et al. | |
| 8,291,776 B1 | 10/2012 | Pickens | |
| 8,296,670 B2 | 10/2012 | Matthews et al. | |
| 8,310,350 B2 | 11/2012 | Pfau et al. | |
| 8,310,452 B2 | 11/2012 | Takenaka et al. | |
| 8,319,727 B2 | 11/2012 | Norieda | |
| 8,373,664 B2 | 2/2013 | Wright | |
| 8,378,798 B2 | 2/2013 | Bells et al. | |
| 8,378,965 B2 | 2/2013 | Gregorio et al. | |
| 8,400,410 B2 | 3/2013 | Taylor | |
| 8,421,567 B2 | 4/2013 | Eckl et al. | |
| 8,482,381 B2 | 7/2013 | Chatterjee et al. | |
| 8,487,759 B2 | 7/2013 | Hill | |
| 8,488,308 B2 | 7/2013 | LeVasseur | |
| 8,502,547 B2 | 8/2013 | Philipp | |
| 8,536,978 B2 | 9/2013 | Coggill | |
| 8,570,162 B2 | 10/2013 | Ujii | |
| 8,570,297 B2 | 10/2013 | Bulea | |
| 8,581,901 B2 | 11/2013 | Joshi | |
| 8,587,542 B2 | 11/2013 | Moore | |
| 8,610,684 B2 | 12/2013 | Kalu et al. | |
| 8,633,901 B2 | 1/2014 | Orr et al. | |
| 8,633,911 B2 | 1/2014 | Schediwy et al. | |
| 8,633,916 B2 | 1/2014 | Bernstein et al. | |
| 8,648,816 B2 | 2/2014 | Homma et al. | |
| 8,671,782 B2 | 3/2014 | Mink | |
| 8,686,839 B2 | 4/2014 | Posamentier | |
| 8,686,961 B2 | 4/2014 | Yamano | |
| 8,717,152 B2 | 5/2014 | Bhatia et al. | |
| 8,730,199 B2 | 5/2014 | Sleeman et al. | |
| 8,783,106 B1 | 7/2014 | Nielson et al. | |
| 8,799,827 B2 | 8/2014 | Hinckley et al. | |
| 8,810,522 B2 | 8/2014 | Tse | |
| 8,836,648 B2 | 9/2014 | Wilairat | |
| 8,854,317 B2 | 10/2014 | Homma et al. | |
| 8,884,892 B2 | 11/2014 | Bakker | |
| 8,898,564 B2 | 11/2014 | Grant | |
| 8,901,783 B2 | 12/2014 | Gregory et al. | |
| 8,907,661 B2 | 12/2014 | Maier | |
| 8,915,422 B1 | 12/2014 | Harty | |
| 8,976,537 B2 | 3/2015 | Ito | |
| 8,982,051 B2 | 3/2015 | Rosenfeld et al. | |
| 9,001,060 B2 | 4/2015 | Harris | |
| 9,013,430 B2 | 4/2015 | McCann | |
| 9,030,419 B1 | 5/2015 | Freed | |
| 9,054,627 B2 | 6/2015 | Garg et al. | |
| 9,086,740 B2 | 7/2015 | Furukawa | |
| 9,110,532 B2 | 8/2015 | Ando et al. | |
| 9,122,325 B2 | 9/2015 | Peshkin | |
| 9,122,345 B2 | 9/2015 | Chen | |
| 9,128,523 B2 | 9/2015 | Buuck | |
| 9,148,190 B1 | 9/2015 | Buuck et al. | |
| 9,207,801 B2 | 12/2015 | Schediwy et al. | |
| 9,222,693 B2 | 12/2015 | Gourlay | |
| 9,223,471 B2 | 12/2015 | Buxton | |
| 9,262,002 B2 | 2/2016 | Momeyer et al. | |
| 9,274,682 B2 | 3/2016 | Hinckley et al. | |
| 9,282,893 B2 | 3/2016 | Longinotti-Buitoni et al. | |
| 9,298,260 B2 | 3/2016 | Karaoguz | |
| 9,304,587 B2 | 4/2016 | Wright et al. | |
| 9,348,473 B2 | 5/2016 | Ando | |
| 9,349,552 B2 | 5/2016 | Huska | |
| 9,372,543 B2 | 6/2016 | Lo et al. | |
| 9,389,686 B2 | 7/2016 | Zoller | |
| 2004/0080494 A1 | 4/2004 | Fahlman | |
| 2007/0152966 A1 | 7/2007 | Krah et al. | |
| 2008/0068343 A1 | 3/2008 | Hoshino et al. | |
| 2008/0084384 A1 | 4/2008 | Gregorio et al. | |
| 2008/0165159 A1 | 7/2008 | Soss et al. | |
| 2008/0191648 A1 | 8/2008 | Ito et al. | |
| 2008/0297478 A1 | 12/2008 | Hotelling et al. | |
| 2009/0002199 A1 | 1/2009 | Lainonen et al. | |
| 2009/0115734 A1 | 5/2009 | Fredriksson | |
| 2009/0167704 A1 | 7/2009 | Terlizzi et al. | |
| 2009/0174672 A1 | 7/2009 | Schmidt | |
| 2009/0225046 A1 | 9/2009 | Kim | |
| 2009/0242282 A1 | 10/2009 | Kim | |
| 2009/0316380 A1 | 12/2009 | Armstrong | |
| 2009/0322183 A1 | 12/2009 | Kawakubo | |
| 2010/0053116 A1 | 3/2010 | Daverman et al. | |
| 2010/0107067 A1 | 4/2010 | Vaisanen | |
| 2010/0141408 A1 | 6/2010 | Doy et al. | |
| 2010/0149111 A1 | 6/2010 | Olien | |
| 2010/0149124 A1 | 6/2010 | Kim | |
| 2010/0164959 A1 | 7/2010 | Brown et al. | |
| 2010/0182263 A1 | 7/2010 | Aunio et al. | |
| 2010/0225600 A1 | 9/2010 | Dai et al. | |
| 2010/0245246 A1 | 9/2010 | Rosenfeld et al. | |
| 2010/0245254 A1 | 9/2010 | Olien et al. | |
| 2010/0328229 A1 | 12/2010 | Weber | |
| 2011/0038541 A1 | 2/2011 | Bober et al. | |
| 2011/0141052 A1* | 6/2011 | Bernstein | G06F 3/016 345/174 |
| 2011/0141053 A1 | 6/2011 | Bulea et al. | |
| 2011/0163985 A1 | 7/2011 | Bae et al. | |
| 2011/0205163 A1 | 8/2011 | Hinckley et al. | |
| 2011/0227872 A1 | 9/2011 | Huska | |
| 2011/0248916 A1 | 10/2011 | Griffin | |
| 2012/0013531 A1 | 1/2012 | Wilson | |
| 2012/0038568 A1 | 2/2012 | Colloms et al. | |

(56) References Cited

U.S. PATENT DOCUMENTS

| | | |
|---|---|---|
| 2012/0050230 A1 | 3/2012 | Harris |
| 2012/0062491 A1 | 3/2012 | Coni et al. |
| 2012/0105358 A1 | 5/2012 | Momeyer et al. |
| 2012/0105367 A1 | 5/2012 | Son et al. |
| 2012/0133496 A1 | 5/2012 | Aono |
| 2012/0139860 A1 | 6/2012 | Hotelling et al. |
| 2012/0154315 A1 | 6/2012 | Aono |
| 2012/0182238 A1 | 7/2012 | Lee |
| 2012/0206246 A1 | 8/2012 | Cruz-Hernandez et al. |
| 2012/0229264 A1 | 9/2012 | Bosch et al. |
| 2012/0249462 A1 | 10/2012 | Flanagan et al. |
| 2012/0319987 A1 | 12/2012 | Woo |
| 2013/0038541 A1 | 2/2013 | Bakker |
| 2013/0076652 A1 | 3/2013 | Leung |
| 2013/0093685 A1 | 4/2013 | Kalu et al. |
| 2013/0154933 A1 | 6/2013 | Sheik-Nainar |
| 2013/0179827 A1 | 7/2013 | Eriksson et al. |
| 2013/0222267 A1* | 8/2013 | Almalki ............... G06F 3/016 345/173 |
| 2013/0222289 A1 | 8/2013 | Kwak |
| 2013/0321290 A1 | 12/2013 | Oh |
| 2014/0028575 A1 | 1/2014 | Parivar |
| 2014/0145836 A1 | 5/2014 | Tossavanen et al. |
| 2014/0191973 A1 | 7/2014 | Zellers |
| 2014/0197936 A1 | 7/2014 | Biggs et al. |
| 2014/0198071 A1 | 7/2014 | Algreatly |
| 2014/0347289 A1 | 11/2014 | Suh |
| 2015/0089435 A1 | 3/2015 | Kuzmin |
| 2015/0109223 A1 | 4/2015 | Kessler et al. |
| 2015/0116205 A1 | 4/2015 | Westerman et al. |
| 2015/0130730 A1 | 5/2015 | Harley et al. |
| 2015/0155474 A1 | 6/2015 | Tanimoto et al. |
| 2015/0169059 A1* | 6/2015 | Behles ............... G06F 3/0488 345/173 |
| 2015/0177899 A1 | 6/2015 | Degner et al. |
| 2015/0192482 A1 | 7/2015 | Araki |
| 2015/0227280 A1 | 8/2015 | Westerman et al. |
| 2015/0234493 A1 | 8/2015 | Parivar et al. |
| 2015/0242037 A1 | 8/2015 | Pedder et al. |
| 2015/0301642 A1 | 10/2015 | Hanaur |
| 2015/0346881 A1 | 12/2015 | Watazu |
| 2016/0085355 A1 | 3/2016 | Pirogov |
| 2016/0091972 A1 | 3/2016 | Patel et al. |
| 2016/0162031 A1 | 6/2016 | Westerman et al. |
| 2016/0188010 A1 | 6/2016 | Wright et al. |

FOREIGN PATENT DOCUMENTS

| | | |
|---|---|---|
| CN | 101482785 | 7/2009 |
| CN | 101523329 | 9/2009 |
| CN | 101763193 A | 6/2010 |
| CN | 101833393 | 9/2010 |
| CN | 101868770 | 10/2010 |
| CN | 102047088 | 5/2011 |
| CN | 102084325 | 6/2011 |
| CN | 102084328 | 6/2011 |
| CN | 102144205 | 8/2011 |
| CN | 102339166 | 2/2012 |
| CN | 102426490 | 4/2012 |
| CN | 102640093 | 8/2012 |
| CN | 1496549 | 10/2012 |
| CN | 102713805 | 10/2012 |
| CN | 102870080 | 1/2013 |
| CN | 103097990 | 5/2013 |
| DE | 102010007486 | 8/2011 |
| EP | 2077490 | 7/2009 |
| EP | 2202619 | 6/2010 |
| EP | 2320309 | 5/2011 |
| EP | 2357547 | 8/2011 |
| EP | 2375306 | 10/2011 |
| EP | 2381340 | 10/2011 |
| EP | 2395414 | 12/2011 |
| EP | 2648071 | 10/2013 |
| JP | 2007034991 | 2/2007 |
| KR | 101274123 | 6/2013 |
| KR | 20130109288 | 10/2013 |
| TW | 201314541 | 4/2013 |
| WO | WO2012/161061 | 11/2012 |
| WO | WO 2013/169299 | 11/2013 |
| WO | WO 2013/169303 | 11/2013 |
| WO | WO 2013/169305 | 11/2013 |
| WO | WO 2014/017407 | 1/2014 |
| WO | WO 2014/018111 | 1/2014 |
| WO | WO 2015/020663 | 2/2015 |

OTHER PUBLICATIONS

Technifast, "Blind Captive Nuts," Jun. 30, 2013, http://www.technifast.co.uk.

Evaluation Report, dated Dec. 23, 2015, ZL2015207460716, 6 pages.

"Immersion Announces MOTIV™ Development Platform for Android," retrieved from the Internet: URL:http://ir.immersion.com/releasedetail.cfm?sh_email=no&releaseid=549080, Feb. 10, 2011.

Zordan, Enrico et al., "Principle design and actuation of a dual chamber electromagnetic micropump with coaxial cantilever valves," Biomedical Microdevices, Kluwer Academic Publishers, BO, vol. 12, No. 1, Oct. 17, 2009, pp. 55-62.

International Search Report and Written Opinion, dated Feb. 12, 2014, PCT/US2013/052006, 15 pages.

International Search Report and Written Opinion, dated Apr. 24, 2014, PCT/US2014/013206, 12 pages.

Product Specification Sheet: GEEPLUS, VIBRO1 Vibration Actuator, 2 pages, www,geeplus.biz, downloaded on Jul. 15, 2015.

\* cited by examiner

HAPTIC FEEDBACK ASSEMBLY

CROSS-REFERENCE TO RELATED APPLICATIONS

This application is a continuation of U.S. Non-provisional patent application Ser. No. 14/792,267, filed Jul. 6, 2015, and titled "Haptic Feedback Assembly" which claims priority to U.S. Provisional Patent Application No. 62/057,751, filed Sep. 30, 2014 and titled "Haptic Feedback Assembly," and U.S. Provisional Patent Application No. 62/129,943, filed Mar. 8, 2015, and titled "Haptic Feedback Assembly," the disclosures of which are hereby incorporated herein by reference in their entirety.

FIELD

The present invention generally relates to an electromagnetic actuator for providing haptic feedback in a computing device, and more particularly to an electromagnetic actuator that is mechanically and electrically secured to a force-outputting plate.

BACKGROUND

Haptics is a tactile feedback technology that pertains to the sense of touch by applying forces, vibrations or motions to a user. This mechanical stimulation may be used to provide tactile feedback in response to an input command or system state. Haptic devices may incorporate actuators that apply forces or motion for providing touch feedback to a user.

One example of a haptic actuator provides mechanical motion in response to an electrical stimulus. Some haptic feedback mechanisms use mechanical technologies such as vibratory motors, like a vibrating alert in a cell phone, in which a central mass is moved to create vibrations at a resonant frequency. Other haptic feedback mechanisms use force generating devices attached to a touchpad or touchscreen to generate movement that may be sensed by a user. The quality of the haptic feedback may depend upon the mechanical and electrical interconnections between the haptic feedback mechanism and the touchscreen.

SUMMARY

Tactile feedback may be provided using an actuator connected to a touchpad. The actuator may be controlled by actuator drive signals. As a user of an electronic device interacts with the touch pad, the user may make gestures and perform other touch-related tasks. When the user desires to select an on-screen object or perform other tasks of the type traditionally associated with button or keypad actuation events, the user may press downwards against the surface of the track pad. When sufficient force is detected, appropriate action may be taken and drive signals may be applied to the actuator.

The actuator may impart movement to the touch pad. For example, the actuator may drive a coupling member into an edge of the planar touch pad member. Flexible pads may be formed under the force sensors to help allow the touch pad member to move laterally (in-plane with respect to the plane of the planar touch pad member) when the actuator is in operation. This may improve actuator efficiency. The actuator may move the touch pad in response to button press and release events or in response to satisfaction of other criteria in the electronic device.

One embodiment of the present disclosure may take the form of a method for providing haptic feedback in an electronic device. The method includes sensing a first input force by a sensor and providing, via a feedback mechanism, a first feedback corresponding to the first input force, sensing a second input force by the sensor that is at least partially in an opposite direction from the first input force, and providing, via the feedback mechanism, a second feedback corresponding to the second input force.

Another embodiment of the present disclosure may take the form of a haptic device for an electronic device. The haptic device includes a sensor configured to sense a user input and a feedback mechanism in communication with the sensor. The feedback mechanism is configured to provide feedback to a user. The feedback may be varied by the feedback based upon input sensed by the sensor.

Yet another embodiment of the present disclosure may take the form of a track pad for a computing device, the computing device including a processor. The track pad includes a touch assembly defining a user input surface and a sensor in communication with the processor. The sensor is configured to sense user force on the touch assembly. The track pad further includes an actuator connected to the touch assembly and configured to selectively impart movement to the touch assembly. The actuator moves the touch assembly in a direction and at a speed to provide feedback to a user, where the feedback is based, at least in part, on a magnitude and an acceleration of the down-stroke user input force.

The quality of the haptic feedback provided by the actuator is directly related to the quality of the interconnection of the actuator to the touch assembly. Secure electrical and mechanical connections of the actuator to the touch assembly are essential to provide the kind of haptic feedback necessary for a quality user experience. In some embodiments, mechanical fasteners such as screws and washers may be used to provide secure electrical and mechanical interconnections between the actuator and the touch assembly of the track pad.

DETAILED DESCRIPTION

Figure 1:
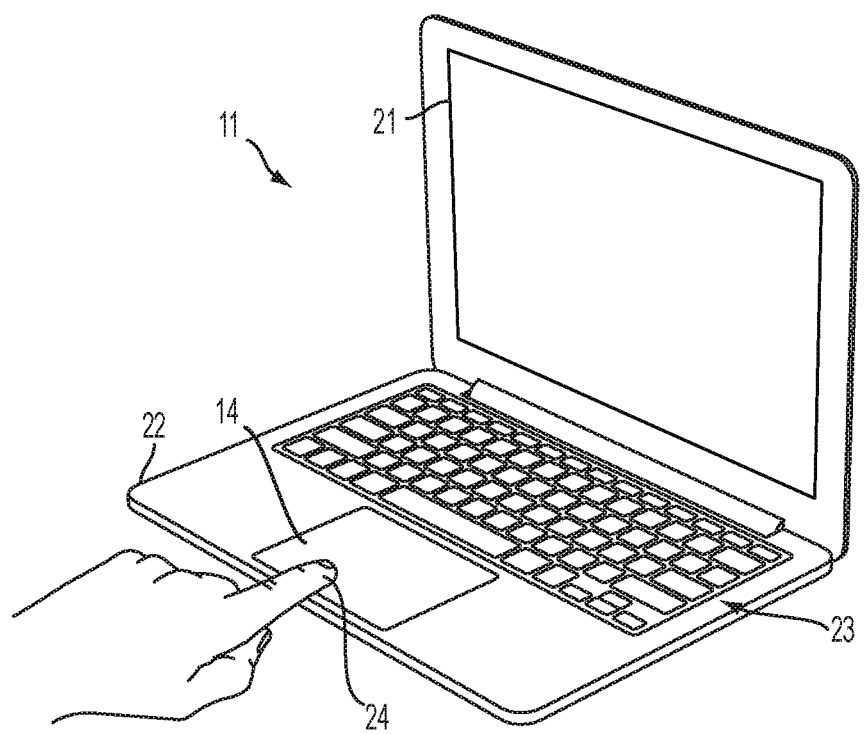
FIG. 1 is a perspective view of an electronic device including a track pad.

The present disclosure may be understood by reference to the following detailed description, taken in conjunction with the drawings as briefly described below. It is noted that, for purposes of illustrative clarity, certain elements in the drawings may not be drawn to scale. Like reference numerals denote like structure throughout each of the various figures.

When a user interacts with a portable electronic device, he or she may be asked to provide certain inputs to the portable electronic device in order for that device to determine the needs and/or wishes of the user. For example, a user may be asked to indicate which of various applications (apps) that the user wishes to access. These apps may be icons on a touchscreen and the user may touch one of these icons to select and access that app. A user may also be prompted to adjust certain functions of the portable electronic device such as sound, picture quality, and the like. This may be done by touching an indicator displayed on a touchscreen and associated with that function. In some applications on a portable electronic device, a user may be prompted to touch numbers or letters on a touchscreen to provide specific input to the portable electronic device. For example a user may spell a word or complete a form by entering a mark in a certain location.

In all of the above situations, a user wants to ensure that the appropriate app icon or portion of the screen that represents his or her true intention is touched. In order to satisfy this need for confirmation, the user may desire physical confirmation of this touch. Such physical confirmation could be made visually by the portable electronic device, which may confirm on a display screen that the user instructions have been received. Similarly and in some embodiments, the user may wish to receive physical confirmation in the form of haptic feedback from the portable electronic device that his or her commands or inputs have been received. This feedback may be made in the form of tactile feedback by applying forces, vibrations or motions from the portable electronic device to the person of the user. In some embodiments, this force or vibration is applied to the body part of the user that is in contact with, or otherwise accessible by, the portable electronic device. In some embodiments, this accessible portion is the finger or fingers of a user that may be in contact with the touchscreen of the device during the process of making the selection of the app or other function that he or she wishes to select. In order to provide this haptic feedback, some portable electronic devices may incorporate actuators that apply forces or motion to a track pad or touchscreen and in turn to provide touch feedback to a user.

Generally, embodiments described herein may take the form of a haptic assembly for providing haptic feedback to a user. A haptic actuator may provide the haptic output in response to an input signal or an output signal, or as part of an output signal. The actuator may vary its output in order to shape and control the haptic response and thus the sensation experienced by a user. In some embodiments, the actuator may be electromagnetically controlled. Embodiments described herein may be incorporated into a variety of electronic or electrical devices, such as a track pad, mouse, display, or other input (or output) device. The haptic device may be incorporated into an electronic device such as a laptop computer, smart phone, digital music player, tablet computing device, portable computing device, feedback or outputs for appliances, automobiles, touchscreens, and the like.

Referring to FIG. 1, a portable electronic device may take the form of a laptop computer system 11 and typically includes a display 21 mounted on a housing 22. Display 21 may provide an image or video output for the electronic device 11. Display 21 may be substantially any size and may be positioned substantially anywhere on the electronic device 11. In some embodiments, the display 21 may be a liquid crystal display screen, plasma screen, light emitting diode screen, and so on. The display 21 may also function as an input device in addition to displaying output from the electronic device 11. For example, display 21 may include capacitive touch sensors, infrared touch sensors, or the like that may capture a user's input to the display 21. In these embodiments, a user may press on the display 21 in order to provide input to the electronic device 11. In alternate embodiments display 21 may be separate from or otherwise external to the electronic device 11, but may be in communication therewith to provide a visual output for the electronic device.

Referring again to FIG. 1, computer system 11 further may include user interfaces such as a keyboard 23 to allow a user to provide input to computer system 11. For example, one type of input may be a user's touch or amount of force exerted on a track pad 14 by a user's finger 24, and another type of input may be based on an accelerometer within the electronic device 11. In addition to varying the feedback provided to a user, the haptic device and/or the processor of the electronic device may register different inputs to the haptic device differently. In other words, as the user varies his or her input to receive different types of feedback, those various inputs may also be registered by the system as different from one another.

Figure 2:
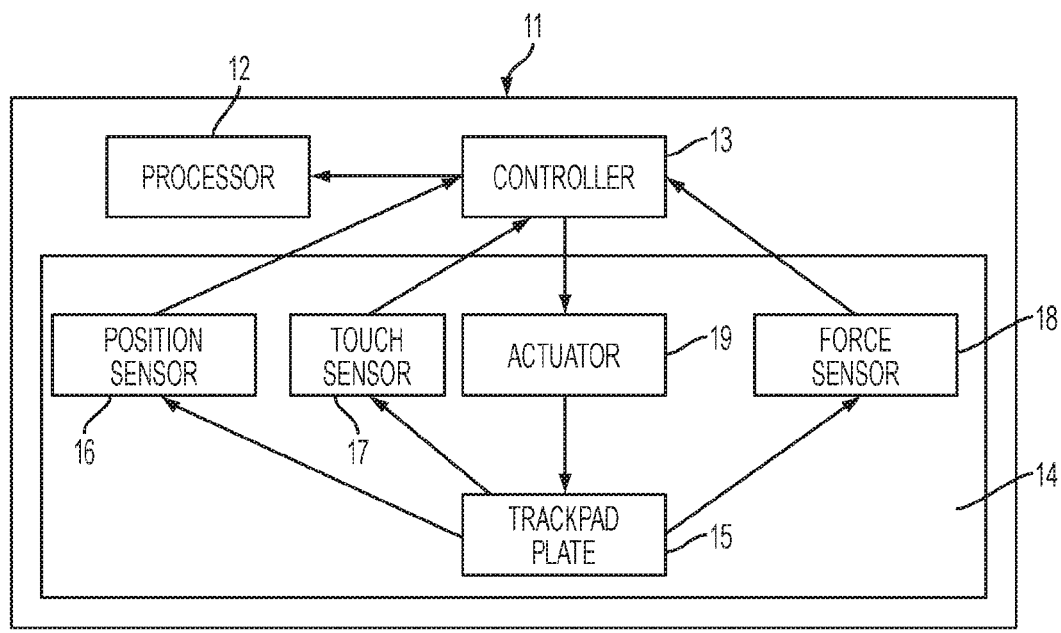
FIG. 2 is a block diagram illustrating a computer system.

FIG. 2 is a schematic illustrating a computer system including a haptic device in accordance with a sample embodiment. The computer system 11 includes a processing unit 12, a controller 13, and a track pad 14. Controller 13 may execute instructions and carry out operations associated with portable electronic devices as are described herein. Using instructions from device memory, controller 13 may regulate the reception and manipulation of input and output data between components of electronic device 11. Controller 13 may be implemented in a computer chip or chips. Various architectures can be used for controller 13 such as microprocessors, application specific integrated circuits (ASICs) and so forth. While computer system includes a processor 12 and controller 13, in some embodiments the functions of controller 13, as described herein, may be implemented by processing unit 12 and controller 13 may be omitted. Controller 13 together with an operating system may execute computer code and manipulate data. The operating system may be a well-known system such as iOS, Windows, Unix or a special purpose operating system or other systems as are known in the art. Controller 13 may include memory capability to store the operating system and data. Controller 13 may also include application software to implement various functions associated with portable electronic device 11.

Track pad 14 may include at least one optional position sensor 16, at least one touch sensor 17, and at least one force sensor 18, and one or more actuators 19 as well as a track pad plate surface 15. Touch sensor 17 may, in some embodiments be a capacitive sensor that senses a finger or other touch through either mutual or self-capacitance. In other embodiments, a strain gauge, resistive sensor, optical sensor, and the like may be used to sense a touch.

In some embodiments, the position sensor(s) 16 may be an accelerometer, motion sensor, optical sensor, Hall sensor, capacitive sensor, or the like. Each of the touch sensor(s) 17, the position sensor(s) 16, the force sensor(s) 18 and actuator 19 are coupled to the track pad 14 and controller 13 and/or processing unit 12. Force sensors 18 may be configured to determine an input force that may be exerted on the haptic device by a user, and the acceleration sensor 16 may be configured to determine an input speed and/or acceleration of the input force exerted on the haptic device by the user.

Touch sensors 17, which, in one embodiment, may be capacitive sensors, may determine the location of one or more touches by a user on the haptic device. The touch sensor(s) 17 and the force sensor(s) 18 detect the location and force of the touch on the track pad 14 respectively and send corresponding signals to the controller 13. The actuation member 19 may be in communication with processor 12 and/or the input sensors and may provide movement to all or a portion of the surface of track pad 14 in response to one or more signals from the processor. For example, the actuator 19 may be responsive to one or more input signals and move the feedback surface in various manners based on the one or more input signals. It should be appreciated that the force sensor(s) 18 may detect non-binary amounts of force. That is, exerted force may be detected across a continuum of values ranging from a minimum to a maximum. The force may be absolutely determined or correlated within this continuum, or the force may be assigned to one of a number of levels or bands within the continuum. In this manner the track pad 14 may be different from a switch or other conventional input device that is either closed or open, or on or off, or the like.

In some embodiments, the force sensor 18 may be a capacitive sensor. Such a sensor may detect force either through mutual capacitance or self-capacitance. The force sensor 18 may include multiple electrodes separated by a gap, in one embodiment. The electrodes may be formed in an array, as sheets, a single pair of electrodes, a structure divided into subsets of electrodes, and so on. Typically, the gap separates paired electrodes (e.g., one electrode of each pair is located at a corresponding side of the gap) although this is not necessary. The gap may be an air gap, a gel, a foam, and so on.

As a force is exerted on a surface of the haptic device (or other associated device), the gap may compress and the electrodes on either side of the gap may move closer to one another. The reduction in distance between the electrodes may increase a capacitance between the electrodes; this increase in capacitance may be correlated to the force exerted on the surface. Alternately, a single row or layer of electrodes may be positioned on one side of the gap. Capacitance between an object exerting force on the surface and one or more electrodes may increase as the gap decreases, which occurs as the force increases. Again, the change in capacitance may be correlated to an exerted force. It should be appreciated that increases in distance (e.g., increases in gap) may be correlated to decreasing force.

In still other embodiments, the force sensor 18 may be an ultrasonic force sensor. Ultrasonic energy may be emitted toward the surface of the track pad 14 (or other structure or device). The amount of reflected energy may vary as an object contacts the surface and/or as an object exerts force on the surface. Accordingly, the amount of energy received by an ultrasonic receiver maybe correlated to an exerted force.

In yet other embodiments, the force sensor may be an optical force sensor, a resistive force sensor, a strain sensor, a pyroelectric sensor, and so on. As another example, the force sensor 18 may be one or more strain gauges. As force is exerted on the structure, the force may be transmitted through one or more legs or other supports. These legs may bend or otherwise deflect in response to the exerted force. A strain gauge may be mounted to a leg, or one strain gauge to each leg, or any combination of strain gauges may be mounted to any combination of legs. Deformation of the legs may bend the strain gauges and thus induce a measurable strain. The greater the exerted force, the greater the deformation and the greater the strain. In this manner, strain may be correlated to force in a non-binary fashion.

Figure 4:
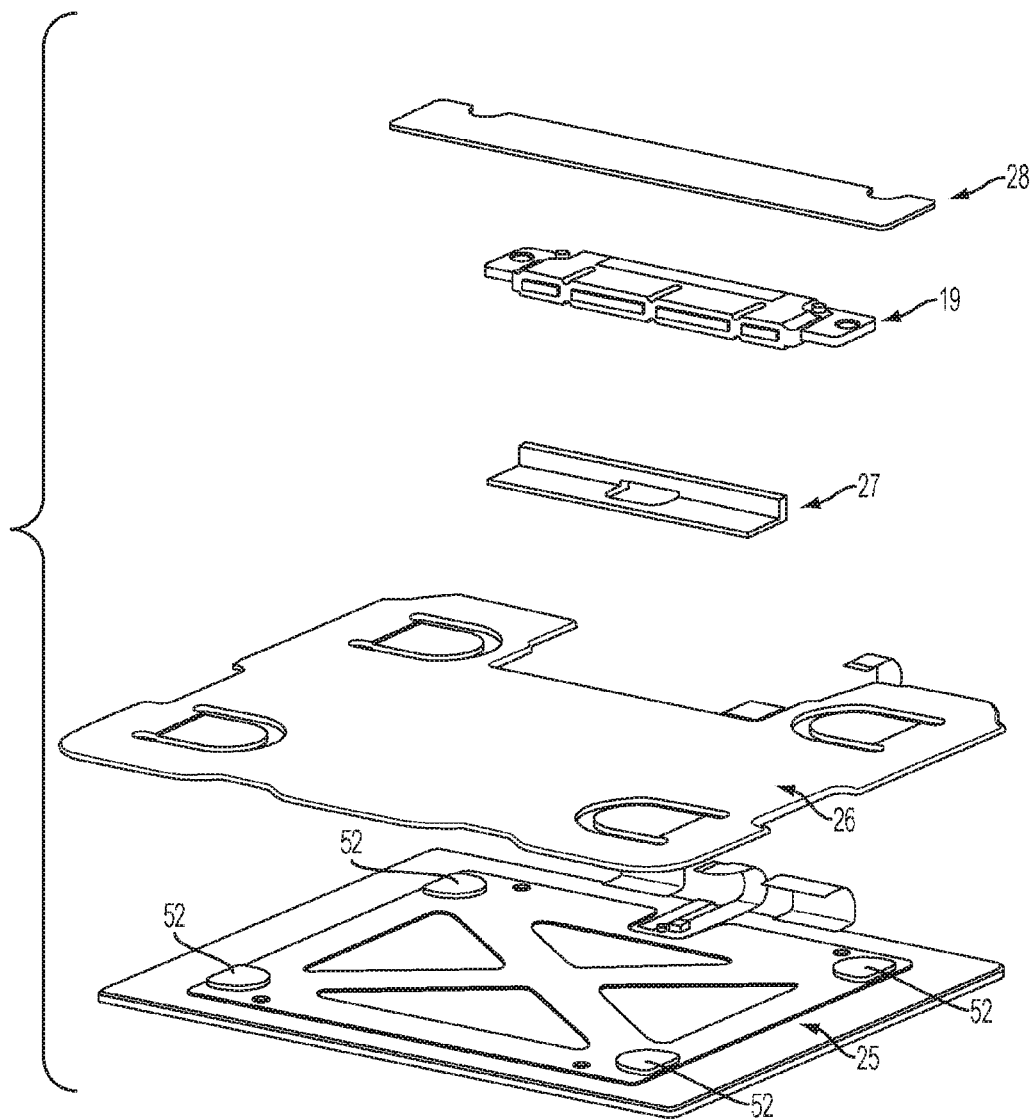
FIG. 4 is an exploded view of one embodiment of a force assembly, touch assembly, and actuator.

As one example of the foregoing, FIG. 4 shows an exploded view of a sample track pad with the outer surface of the pad at the bottom of the figure (e.g., the exploded view is upside down such that the interior of the track pad is at the top of FIG. 4). The force assembly 26 may define multiple legs therein and a strain gauge may be mounted on each leg. As force is exerted on the track pad surface, the legs formed in the force assembly 26 may deflect or deform in the aforementioned manner. Each leg may have a strain gauge mounted thereon (not shown) to measure the corresponding strain in order to estimate an exerted force.

Some embodiments described herein may take the form of a haptic device for use with an associated electronic device such as computer system 11. The haptic device may vary output provided to the user based on a number of different inputs to the haptic device. Additionally, the haptic device may vary one or more inputs provided to the computer device 11 based on the user inputs. Inputs to computer device 11 may include a processor or device command based on a system state, application activity, sensor data, and so on. Thus, the haptic device may adapt the feedback, as well as the types of input provided to computer 11 from the haptic device, based on one or more characteristics, settings, or inputs (as provided to a particular application).

As another example, the haptic device may provide varying feedback depending on the particular application running on the electronic device, the force input member (e.g., index finger, thumb, palm of the user), the amount of input force, the speed or acceleration of the input force, the length of time an input force is applied, location of the electronic device, and/or various other types of data inputs that may be provided to the haptic device, to the electronic device, or a combination of both. It should be noted that the data inputs to vary the output of the haptic device may be provided by a user, the haptic device, and/or the electronic device 11.

One embodiment for providing haptic feedback is described below. When using track pad 14 to provide input to the computer system 11, a user may move his or her finger 24 on track pad 14 to a desired location. The user may also touch track pad 14 at a desired location to provide input. Touch sensor(s) 17 and the force sensor(s) 18 detect the location and force of the touch on track pad 14 respectively and generate corresponding signals sent to the controller 13. Controller 13 communicates with processing unit 12 inside computer system 11 and processing unit 12 may generally instruct controller 13 with respect to certain operations. As one non-limiting example, processing unit 12 and controller 13 in combination may use these signals to determine if the location of the touch correlates with a specific application or a user interface (UI) element. If the location is within the range for the specific application or UI element, processing unit 12 further determines if the force signal is above a threshold. If so, processor 12 may validate the force signal as a selection of the application of UI element. In other words, if the force signal is not a false signal, then controller 13 activates actuator 19, which moves the surface of the track pad 14 beneath the user's finger 24. The user may sense this motion, thereby experiencing haptic feedback in response to the application or UI element selection. Position sensor 16 detects how much track pad 14 moves relative to the actuator 19 after an actuation event, or vice versa, and may be omitted in some embodiments.

In another embodiment, track pad 14 may detect a user input, such as a user touch or a user force. In this example, substantially any type of detected user input may be used to provide feedback to the user. Based on the user input, track pad 14 may be activated by the processor 12 to move or vibrate to provide haptic feedback to a user. In some instances, the user input may be correlated to a specific application or UI element, in which case the location of the user input may be analyzed to determine if feedback is desired. In other instances, the mere detection of a user input may be sufficient to initiate haptic feedback. It should be noted that haptic feedback may be provided in response not only to a user input, an example of which is provided above, but also in response to system operation, software status, a lack of user input, passage of user input over UI elements(s) (e.g., dragging a cursor over a window, icon, or the like), and/or any other operating condition of computer system 11.

Figure 3:
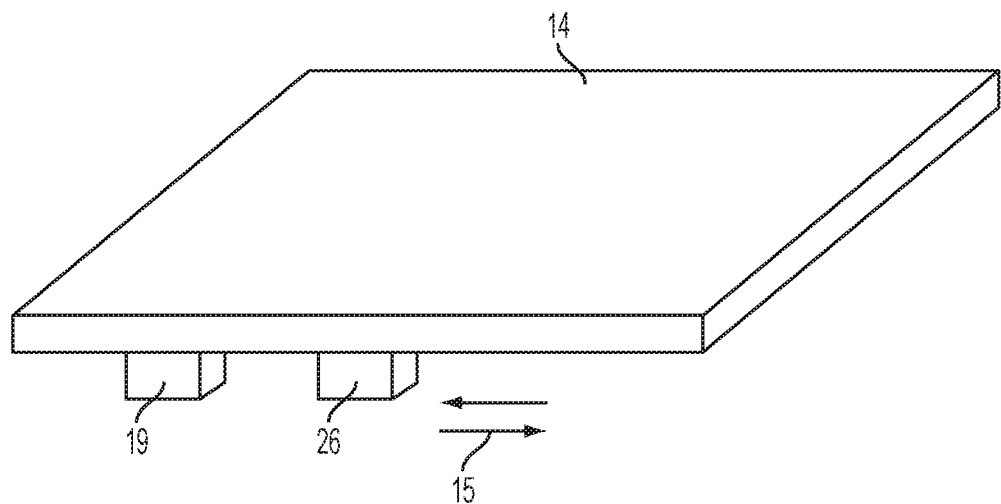
FIG. 3 is a schematic showing a touch assembly which includes touchpad connected to an actuator by a force assembly.

Referring to FIG. 3, a schematic of a track pad 14 with an actuator 19 is shown. As mentioned above, the quality of the haptic feedback provided to a user may depend upon the quality of the interconnections, both electrical and mechanical, that secure actuator 19 to the user-sensing surface, which may be track pad 14. In one embodiment, one or more actuators 19 are positioned below track pad 14 and coupled thereto by a force assembly 26 to provide vibratory or other motion to track pad 14. In another embodiment, actuators 19 may be positioned apart from track pad 14 and coupled by a force assembly 26 thereto. The coupling of track pad 14 to actuator 19 by force assembly 26 in either embodiment will be described in more detail below with respect to FIGS. 4-13.

Referring to FIG. 4, in one embodiment, an exploded view of an input device including a force assembly, 26, touch assembly 25, and actuator 19, is shown. An attraction plate 27 and an electronic device board 28 are also shown. The interaction of actuator 19 and attraction plate 27 provide a haptic output to touch assembly 25 when the actuator 19 is energized; generally, the actuator may magnetically attract the attraction plate 27, thereby moving the track pad 14. When the actuator 19 is de-energized, it no longer magnetically attracts the plate 27 and the track pad 14 may be returned to its neutral/unloaded position by a restoring force exerted by a gel plate or gel structures.

The attraction plate 27 may be affixed to the force assembly while the actuator is affixed to the touch assembly 25 or other surface of the track pad. Flexible structures 52 may attach the track pad (and more specifically a structural layer of the track pad) to the arms formed in the force assembly 26. The flexible pads may transmit a force exerted on the surface of the input device to the legs, shown as extensions within C-shaped cuts formed in the force assembly 18. Force sensors 18 mounted on the legs may measure the force. Typically, the force sensors 18 may be positioned near the contact point of the flexible structures 52 with the legs, although this is not necessary.

The legs may be formed unitarily with the rest of the force assembly 26 by cutting a series of C-shaped trenches into the force assembly; each such trench defines a unique leg in the current embodiment. The force assembly 18 may be connected to a structural part of an associated electronic device, such as an interior plate or housing. Thus, the legs may permit some flexure or displacement of the track pad surface with respect to the force assembly by bending or otherwise deforming. As previously mentioned, this deformation may be sensed by one or more force sensor 18 and used to determine or estimate an exerted force.

A support structure may sit between the flexible structures 52 and the touch assembly 25. The support structure may be formed as a square or rectangle with diagonal cross beams forming an X-shape in the middle of the support structure (e.g., extending from one diagonally opposing corner to another). This particular shape may stiffen the track pad while still permitting the transfer of force to the force sensor(s) 18 and may be lighter than a planar support structure.

Figure 5:
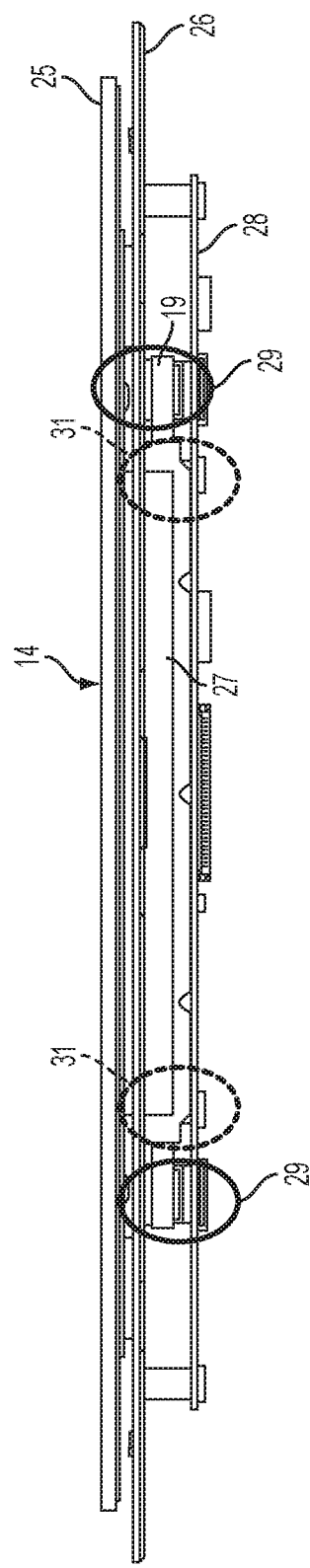
FIG. 5 is a side view of the embodiment illustrated in FIG. 4 shown in an assembled implementation with an actuator interconnected with a force assembly.

Referring to FIG. 5, a side view of the embodiment illustrated in FIG. 4 is shown in an assembled implementation with actuator 19 interconnected with force assembly 26 at interconnect points 29 which will be further described below in FIGS. 6 and 7. Actuator 19 is also securely connected, both electromagnetically and mechanically to board 28 at interconnect points 31 which will be further described below in FIG. 8. As stated above, the secure interconnection of actuator 19 to both force assembly 26 and electronic board 28 is important to ensure that quality haptic feedback is provided to a user of electronic device 11 by interacting with touch pad assembly 25 including track pad 14 surface.

Figure 6:
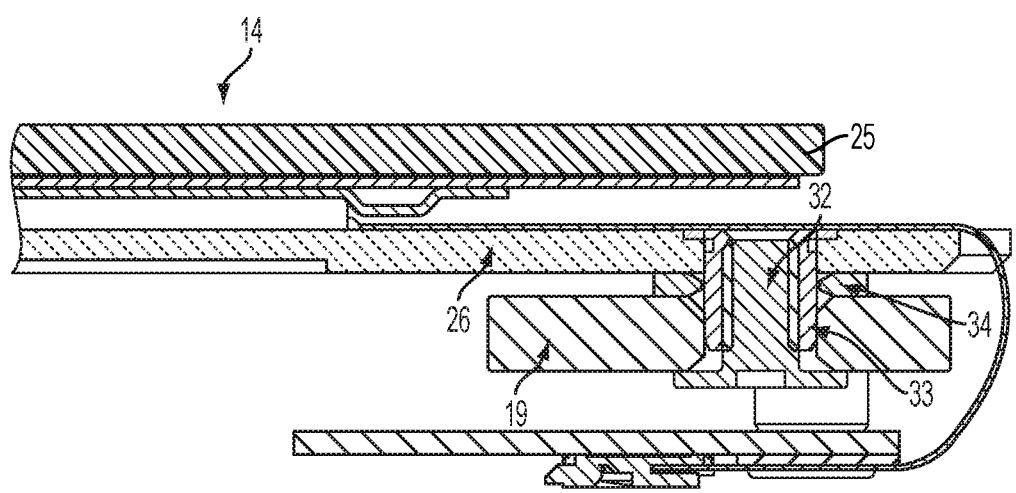
FIG. 6 is a side view of one embodiment of an interconnect point of FIG. 5.

Referring to FIG. 6, in one embodiment, a side view of interconnect point 29 of FIG. 5 is shown in an expanded view. Actuator 19 is shown mechanically interconnected to force assembly 26 by a mechanical fastener such as a screw 32. Screw 32 may be threaded into insert 33 which is attached to, and part of, force assembly 26. Insert 33 may be glued, press fit, or otherwise attached to force assembly 26. A spacer 34 may be included between actuator 19 and force assembly 26 to facilitate connection of actuator 19 with force assembly 26. This secure mechanical interconnection between actuator 19 and force assembly 26 results in vibrational, lateral, or other movement by actuator 19 being efficiently transferred to force assembly 26 and thence to touch assembly 25 such that a user may benefit from haptic feedback as described herein.

Figure 7:
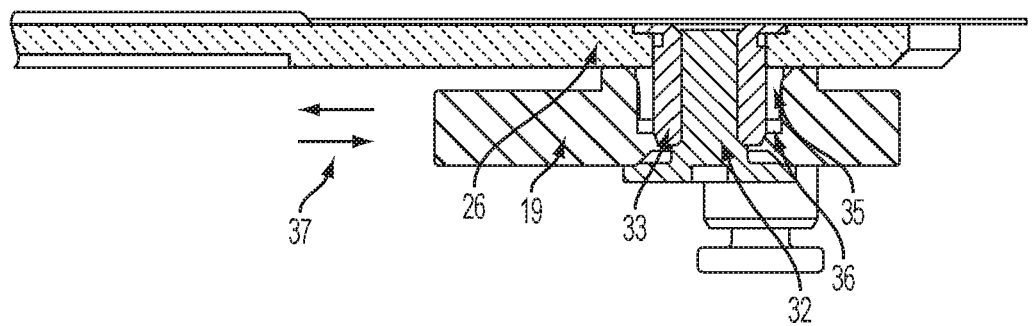
FIG. 7 is a side view of an alternate embodiment of an interconnect point of FIG. 5.

Referring to FIG. 7, a side view of an alternate embodiment of interconnect point 29 of FIG. 6 is shown in an expanded view. In this embodiment, in addition to screw 32 which is threaded into insert 33 and used to connect actuator 19 to force assembly 26, a washer 35 may be used to further interconnect actuator 19 to force assembly 26. Washer 35 may be a plastic ring that is press fit into a recess 36 in actuator 19. Threaded insert 33 fits into washer 35 such that shifting movement of actuator 19 with respect to force assembly 26 is minimized or eliminated. That is, tighter tolerances than would otherwise be achievable may be maintained by use of washer 35 which in one embodiment, may be a plastic ring which may be pliable so as to reduce or eliminate gaps between insert 33 and actuator 19. Movement of actuator 19 in the lateral direction as indicated by arrows 37 may thus be accomplished without movement of actuator 19 in recess 36 between actuator 19 and insert 33.

Figure 8:
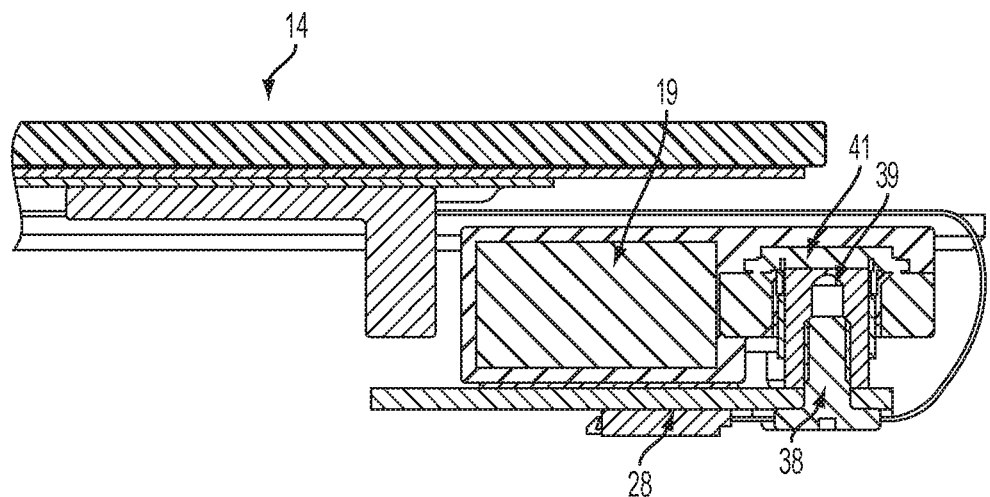
FIG. 8, is one embodiment of the electromagnetic connection between the actuator and device board.

Referring to FIG. 8, in one embodiment, the electromagnetic connection between actuator 19 and device board 28 is illustrated by an expanded view of interconnect points 31 from FIG. 5. In one embodiment, an electrically conductive mechanical fastener such as a screw 38 is used to connect actuator 19 and circuit board 28 through an electrically conductive emboss element 39. Screw 38 provides an electrical path from actuator printed circuit board (PCB) 41 to embossed portion 39 then to screw 38 and thence to circuit board 28. In this manner a secure electromagnetic interconnection may be made between circuit board 28 and actuator board 41.

Figure 9:
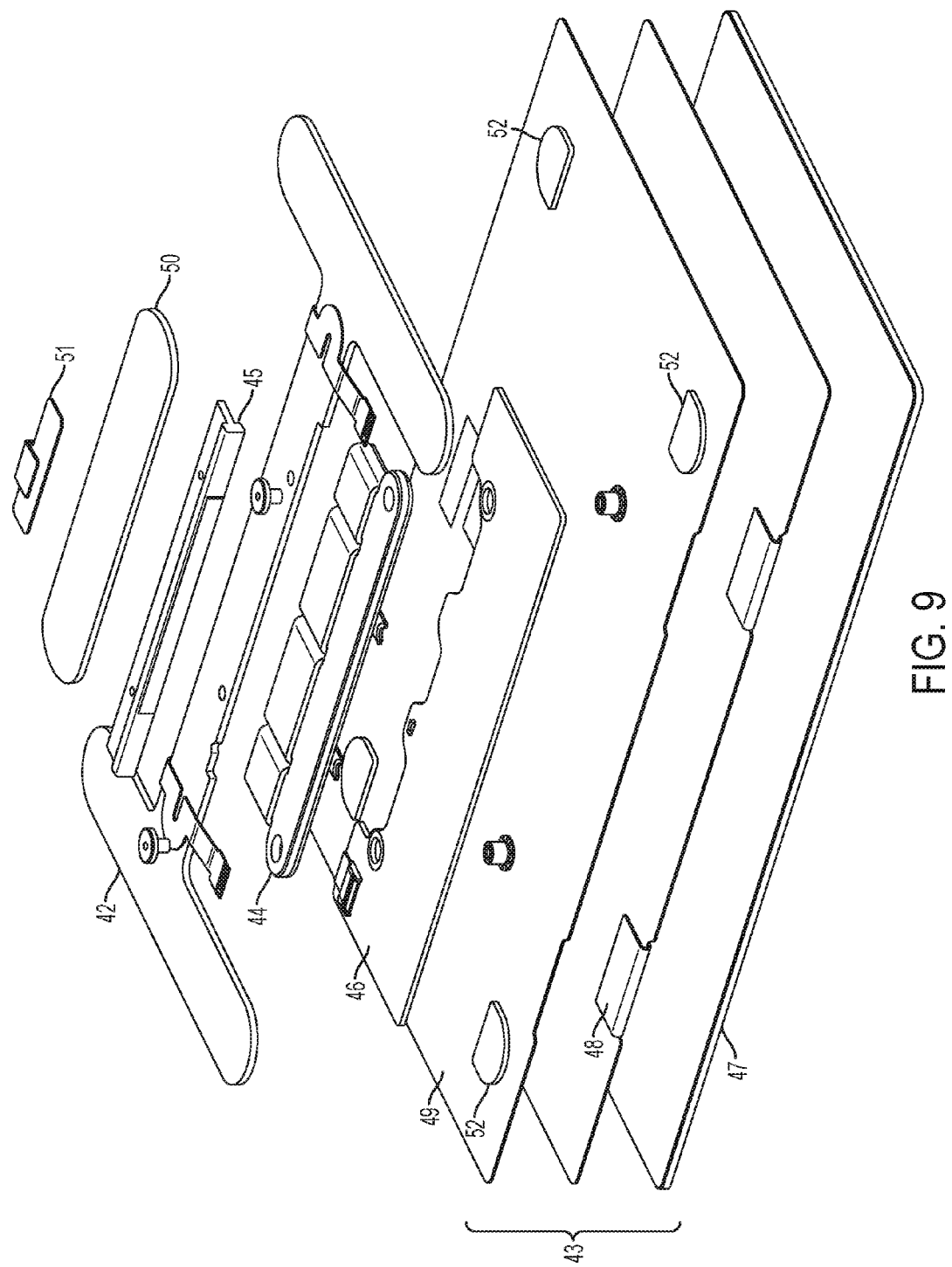
FIG. 9 is an exploded view of an alternate embodiment of a force assembly, touch assembly, and actuator assembly.

Referring to FIG. 9, an exploded view of an alternate embodiment of an input device including a force assembly 42, touch assembly 43, and actuator 44, is shown. An attraction plate 45 and an electronic device board 46 are also shown. The interaction of force assembly 42, actuator 44, and attraction plate 45 provide the force to touch assembly 43 as energized through device board 46 and generally as described above with respect to other embodiments. Touch assembly 43 includes glass cover layer/top plate 47, touch sensor layer 48 and touch grounding layer 49, which may also be a stiffening or structural support layer in certain embodiments. An electrostatic discharge clip (or other structure) 51 may be attached between attraction plate 45 and force sensor assembly 42. In some embodiments, the clip 51 may be made from metal, a conductive alloy, a conductive ceramic, a stiff nonconductive material having a conductive path formed therein, or the like. In other embodiments, the clip 51 may be formed from a conductive fabric and attached to the plate 45 and assembly 42 with a conductive adhesive. The use of a conductive fabric may permit the clip 51 to move, bend or flex with operation of the device or as components shift with respect to one another over time.

The force assembly 42 may be H-shaped, as shown in FIG. 9. This shape may permit or enhance localized bending of the force assembly in a region or regions occupied by the force sensor(s) 18, thereby enhancing the ability of the sensor(s) to detect force. Insofar as the force sensor(s) are located on the underside of the force assembly in the view shown in FIG. 9, they are not visible in the figure.

Certain embodiments may incorporate a stiffener to stiffen and/or stabilize any or all of the force assembly 42, touch assembly 43, actuator 44, and/or top plate 47. The stiffener 50 may be affixed to any of a number of elements of the force assembly 42. For example, it may be attached to the force assembly 42 near or adjacent to the attraction plate 45. In other embodiments, the stiffener may be affixed between the force sensor assembly 42 and the top plate 47 (or a touch assembly, flex, adhesive or other layer affixed to the top plate 47). Such an embodiment is shown in cross-section in FIG. 11, for example. The stiffener 50 may be formed from any suitable material, examples of which include carbon fiber, steel, aluminum, ceramics, and so on. The stiffener 50 may be used in a variety of embodiments, including that shown in FIG. 4.

Figure 10:
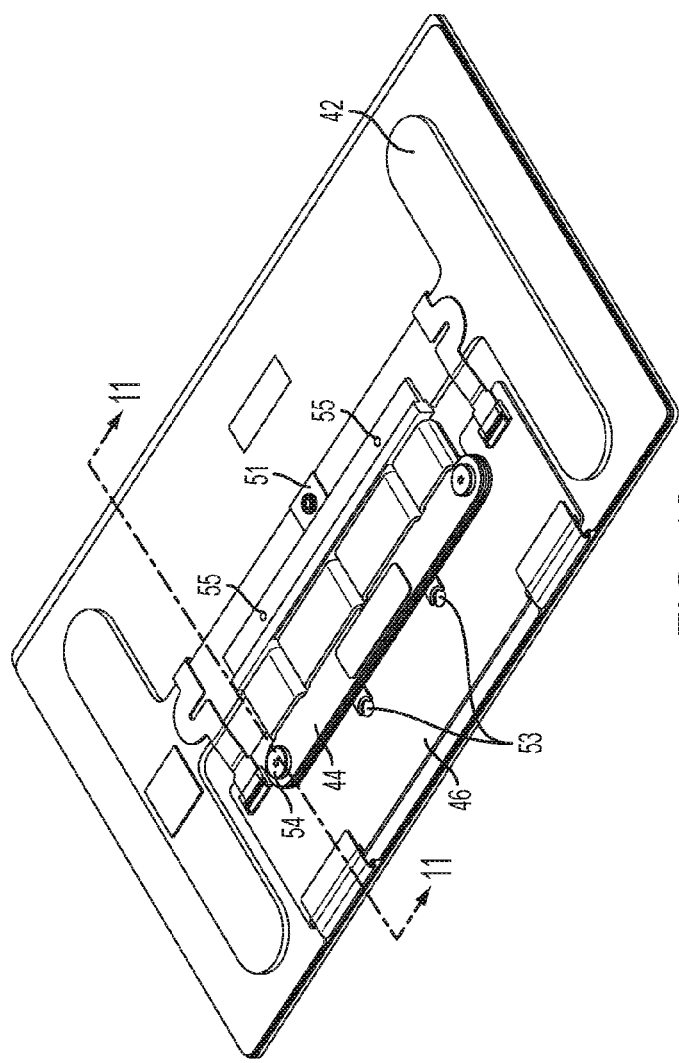
FIG. 10 is an assembled view of the embodiment of FIG. 9.

Referring to FIG. 10, the exploded view of FIG. 9 is shown assembled and from a bottom view. Circuit board 46 is soldered to actuator 44 at solder pads 53 to provide the electrical power connection for actuator 44. Force assembly 42 contacts touch assembly 43 at flexible pads 52 (FIG. 9) which may be compliant foam or gel pads. Thus, force assembly 42 may move laterally at least somewhat with respect to top plate 47, insofar as lateral motion of the force assembly 42 may apply a shear force to the gel or foam pads 52.

Actuator 44 is securely mechanically attached to board 46 by a pair of screws 54. This secure mechanical interconnection between actuator 44 and board 46 results in vibrational, lateral, or other movement by actuator 44 being efficiently transferred to force assembly 42 and then to touch assembly 43 through actuator 44 and attraction plate 45 which is securely fastened to force assembly 42 by a pair of pins 55 shown in FIG. 10. This secure interconnection ensures that a user may benefit from more precise haptic feedback as described herein.

Figure 11:
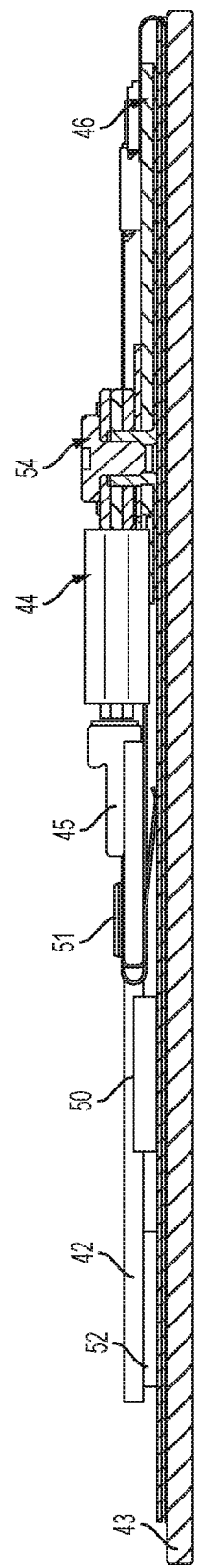
FIG. 11 is a side sectional view of the assembly of FIG. 10 taken along the lines 11-11.

Referring to FIG. 11, a side sectional view of the assembly taken along the lines 11-11 in FIG. 10 is shown. Screw 54 is shown mechanically securing actuator 44 to device board assembly 46. To provide haptic feedback, actuator 44 electromagnetically moves attraction plate 45 that is secured to force assembly 42 at pins 55. Moving force assembly 42 in turn causes haptic feedback by moving the overall structure of the track pad. It should be appreciated that the force assembly 42 is connected to the touch assembly 43 by gel pads 52 while actuator 44 is affixed to board 46 and, ultimately, to plate 49 by mechanical fasteners. Thus, when actuator 44 magnetically attracts actuation plate 45, the two may move closer to one another. This may induce a motion in the touch assembly 43, since it is rigidly affixed to the actuator 44. Essentially, the actuator 44 may move towards the attraction plate 45, which may be rigidly and/or fixedly connected to a portion of an enclosure or otherwise prevented from moving.

The motion of the actuator 44, board 46 and touch assembly 43 toward the plate 45 and force assembly 42 causes the gel pads 52 to shear. When the actuator is de-energized, the gel pads exert a restoring force that moves the actuator (and thus the majority of the track pad, including touch assembly) away from the attraction plate 45. Accordingly, rapidly energizing and de-energizing the actuator may cause the track pad to repeatedly move back and forth quickly, thereby providing a haptic output to a person touching the track pad.

By securely attaching actuator 44 to board assembly 46, the electrical interconnections, which may be solder joints 53, do not loosen or sever from either device board assembly 46 or actuator 44. Thus, haptic feedback can be securely and reliably provided to finger 24 of a user of track pad 14 on an electronic device such as device 11.

Figure 12:
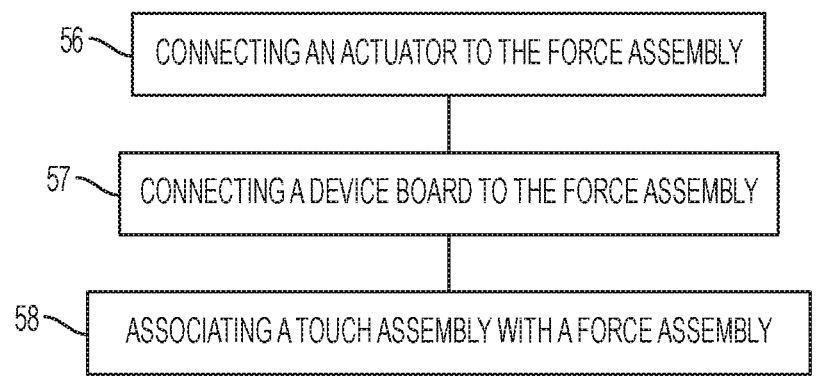
FIG. 12 is a flow chart illustrating one method for manufacturing a track pad.

Referring to FIG. 12, a method for manufacturing a track pad including a haptic feedback device includes providing a touch assembly at step 56 which may include a ground plate 49 that may also provide structural stiffness to the track pad, a sensor plate, and a glass plate for contact by a user's person. At step 57, an actuator is connected to the force assembly. In some embodiments the actuator may be mechanically connected by screws to provide secure interconnection of the actuator with the force assembly. This secure mechanical interconnection between actuator and force assembly results in vibrational, lateral, or other movement by the actuator being efficiently transferred to the force assembly. In some embodiments a washer may be used to further interconnect the actuator to the force assembly. The washer may be a plastic ring that is press fit into a recess in the actuator. A threaded insert may be used to fit into the washer such that shifting movement of the actuator with respect to the force assembly is minimized or eliminated. That is, tighter tolerances than would otherwise be achievable may be maintained by use of the washer, which in one embodiment may be a pliable plastic ring may be that reduces or eliminates gaps between the insert and the actuator.

At step 58, a device board is securely connected to the force assembly also by means of screws. In one embodiment, an electrically conductive screw is used to connect actuator and circuit board through an electrically conductive emboss element. Screw provides an electrical path from the actuator printed circuit board (PCB) to the embossed portion and then to the screw and circuit board. In this manner a secure electromagnetic interconnection may be made between the circuit board and the actuator board. The touch assembly is associated with a force assembly in step 59 which may include placement of flexible pads 52, which may be a foam or gel pad, between the force assembly and the touch assembly.

Figure 13:
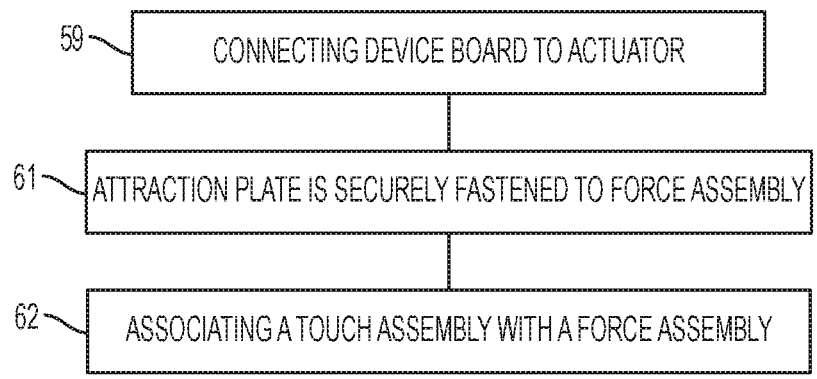
FIG. 13 is a flow chart illustrating an alternate method for manufacturing a track pad.

Referring to FIG. 13 an alternate method for manufacturing a track pad including a haptic feedback device includes providing a touch assembly at step 61 which includes glass cover layer, plastic (PET) touch sensor layer, and a touch grounding layer which may also provide structural stiffness in certain embodiments. At step 62, a circuit board is soldered to the actuator to provide the electrical power connection for actuator. In some embodiments the actuator may be securely mechanically connected to the circuit board by screws.

In step 63, the attraction plate is securely fastened to the force assembly by pins, thereby resulting in vibrational, lateral, or other movement by the actuator being efficiently transferred to the force assembly and then to the touch assembly through the actuator. In step 64, the touch assembly is associated with the force assembly that may include the placement of flexible pads 52 which may be one or more foam or gel pads between force assembly and touch assembly.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

We claim:

1. An electronic device configured to provide haptic feedback and comprising:
   a housing defining an aperture; and
   a trackpad at least partially within the aperture and comprising:
      an input surface movable in a plane parallel to an external surface of the housing;
      a force sensor assembly below the input surface;
      an attractor attached to the force sensor assembly;
      an electromagnetic actuator mechanically interconnected to the input surface and configured to electromagnetically interact with the attractor; and
      an electrical circuit in communication with the electromagnetic actuator;
   wherein:
      in response to a signal, the electrical circuit is configured to apply a current to the electromagnetic actuator to attract the attractor and cause the input surface to translate in the plane.

2. The electronic device of claim 1, wherein the input surface is operative to provide a haptic output by translating in the plane.

3. The electronic device of claim 1, wherein the signal is associated with an input provided by a user when the user is exerting a force on the input surface.

4. The electronic device of claim 1, wherein the current applied to the electromagnetic actuator varies based on the signal.

5. The electronic device of claim 1, wherein the electromagnetic actuator comprises one or more electromagnets configured to attract the attractor.

6. The electronic device of claim 5, wherein the electromagnetic actuator comprises one or more core elements within the electromagnets.

7. The electronic device of claim 1, wherein the force sensor assembly comprises four force-sensitive elements positioned along a periphery of the input surface.

8. The electronic device of claim 1, wherein the input surface is coupled to the force sensor assembly by a compliant structure.

9. A touch input device configured to provide haptic feedback comprising:
   a force assembly comprising a group of force sensors;
   an input surface coupled to and at least partially supported by at least one flexible pad coupled to the force assembly;
   an attraction plate mechanically attached to the force assembly;
   an electromagnetic actuator mechanically attached to the force assembly and configured to electromagnetically interact with the attraction plate, causing the input surface to translate in a plane;
   an electronic board electrically and mechanically attached to the electromagnetic actuator; and
   a flexible circuit coupling each of the group of force sensors to the electronic board;
   wherein
      in response to an actuator drive signal, the electronic board is configured to apply an electrical signal to the electromagnetic actuator to cause the attraction plate to move toward the electromagnetic actuator.

10. The touch input device of claim 9, wherein a magnitude of movement of the attraction plate varies based on the actuator drive signal.

11. The touch input device of claim 9, wherein the actuator drive signal corresponds to a haptic feedback signal.

12. The touch input device of claim 9, wherein the input surface comprises glass.

13. The touch input device of claim 9, wherein the input surface is included in a touch assembly, the touch assembly further comprising a touch sensor layer disposed below the input surface.

14. The touch input device of claim 9, wherein the force assembly comprises an H-shaped structure.

15. The touch input device of claim 14, wherein the group of force sensors comprises four force-sensitive elements associated with and coupled to different locations along the H-shaped structure.

16. The touch input device of claim 9, wherein:
   the electromagnetic actuator is mechanically attached to the force sensor assembly through a mechanical fastener; and
   the electronic board is electrically and mechanically attached to the electromagnetic actuator by the mechanical fastener, wherein
      in response to the actuator drive signal, the electronic board is configured to apply the electrical signal to the electromagnetic actuator through the mechanical fastener to cause the attraction plate to move toward the actuator.

17. A method of providing haptic feedback to a user of a touch input device, the method comprising:
   detecting, with a force assembly, a force exerted on an input surface of the touch input device;

providing a current from a circuit board to an electromagnetic structure of an actuator through a mechanical fastener connecting the actuator to the circuit board, the actuator positioned adjacent to an attractor plate of the input surface; and magnetically attracting the attractor plate toward the electromagnetic structure, thereby causing the input surface to translate in plane.

18. The method of claim 17, wherein the operation of magnetically attracting the attractor plate toward the electromagnetic structure comprises providing an alternating current to the electromagnetic structure, thereby causing the input surface to vibrate in a plane.

19. The method of claim 17, further comprising detecting, with a touch sensor, a user touch on the input surface.

20. The method of claim 17, wherein the current is provided by an electronic circuit coupled to the force assembly.

* * * * *